United States Patent
Ren et al.

(10) Patent No.: US 12,157,940 B2
(45) Date of Patent: Dec. 3, 2024

(54) VACUUM COATING DEVICE

(71) Applicant: BAOSHAN IRON & STEEL CO., LTD., Shanghai (CN)

(72) Inventors: Sanbing Ren, Shanghai (CN); Junfei Fan, Shanghai (CN); Shanqing Li, Shanghai (CN); Fei Xiong, Shanghai (CN); Yiru Wang, Shanghai (CN)

(73) Assignee: BAOSHAN IRON & STEEL CO., LTD., Shanghai (CN)

( * ) Notice: Subject to any disclaimer, the term of this patent is extended or adjusted under 35 U.S.C. 154(b) by 285 days.

(21) Appl. No.: 17/762,302

(22) PCT Filed: Sep. 25, 2020

(86) PCT No.: PCT/CN2020/117883
§ 371 (c)(1),
(2) Date: Mar. 21, 2022

(87) PCT Pub. No.: WO2021/057922
PCT Pub. Date: Apr. 1, 2021

(65) Prior Publication Data
US 2022/0356556 A1    Nov. 10, 2022

(30) Foreign Application Priority Data

Sep. 29, 2019  (CN) .......................... 201910931051.9

(51) Int. Cl.
*C23C 16/26* (2006.01)
*C23C 14/24* (2006.01)
*C23C 14/26* (2006.01)

(52) U.S. Cl.
CPC ............ *C23C 14/26* (2013.01); *C23C 14/243* (2013.01)

(58) Field of Classification Search
CPC ..... C23C 14/16; C23C 14/562; C23C 14/243; C23C 14/543; C23C 14/24; C23C 14/26
See application file for complete search history.

(56) References Cited

U.S. PATENT DOCUMENTS

| 2008/0280066 | A1  | 11/2008 | Westrum et al. |
| 2011/0000431 | A1* | 1/2011  | Banaszak ............. C23C 14/562 |
|              |     |         | 118/694 |

(Continued)

FOREIGN PATENT DOCUMENTS

| CN | 101175866 | 5/2008 |
| CN | 102758185 | 10/2012 |

(Continued)

OTHER PUBLICATIONS

International Search Report for PCT/CN2020/117883 dated Dec. 14, 2020.

(Continued)

*Primary Examiner* — Joseph A Miller, Jr.
(74) *Attorney, Agent, or Firm* — Christopher M. Scherer; DeWitt LLP

(57) ABSTRACT

Provided is a vacuum coating device, comprising a crucible (13), an induction heater (15) arranged on the outer side of the crucible (13); a flow distribution box connected to the top of the crucible (13) through a steam pipeline (16); a pressure regulating valve (18) and a diverter valve (19) sequentially arranged in a direction in which the steam pipeline (16) is in communication with the flow distribution box; a horizontal pressure stabilizing plate (20) arranged in the flow distribution box, a plurality of sub-nozzles (21) connected to the top of the flow distribution box; wherein a plurality of air flow distribution chambers are arranged in the diverter valve (19); a ratio of a total area of the air flow distribution chambers ($S_{distribution}$) to an area of the steam pipeline (16) in the radial direction ($S_{pipeline}$) is greater than (Continued)

or equal to 0.1, i.e.: $S_{diversion}/S_{pipeline} \geq 0.1$. According to the device, a uniform spray flow can be formed, a uniform coating (23) is formed on the surface of a steel plate (100) when high temperature steam is in contact with a low temperature steel plate, the spray flow formed by the sub-nozzles (21) arranged at the rear portion continuously covers the deposited metal layer that has been formed, so as to achieve efficient coating of strip steel under vacuum conditions.

9 Claims, 6 Drawing Sheets

(56) References Cited

U.S. PATENT DOCUMENTS

| | | | |
|---|---|---|---|
| 2013/0199447 A1 | 8/2013 | Nam et al. | |
| 2015/0030761 A1 | 1/2015 | Kato et al. | |
| 2017/0073804 A1* | 3/2017 | Zhao | C23C 14/243 |

FOREIGN PATENT DOCUMENTS

| | | |
|---|---|---|
| CN | 102884594 | 1/2013 |
| CN | 103069543 | 4/2013 |
| CN | 103249860 | 8/2013 |
| CN | 105088147 | 11/2015 |
| CN | 206289295 U | 6/2017 |
| DE | 3527259 | 1/1986 |
| JP | 2007070679 A | 3/2007 |
| JP | 2010150662 A | 7/2010 |
| JP | 2014088591 A | 5/2014 |
| KR | 20120077383 A | 7/2012 |
| WO | 2018020311 | 2/2018 |
| WO | 2018220907 | 12/2018 |
| WO | 2019132206 A1 | 7/2019 |

OTHER PUBLICATIONS

Extended European Search Report issued by the European Patent Office on Sep. 28, 2022 in connection with EP application No. 20868378.9.

Office Action issued by the Japanese Patent Office on May 30, 2023 in connection with JP application No. 2022/519381.

Office Action issued by the Korean Intellectual Property Office on Mar. 15, 2024 in connection with KR application No. 10-2022-7008548.

* cited by examiner

VACUUM COATING DEVICE

CROSS-REFERENCE TO RELATED APPLICATIONS

The present application is the U.S. National Stage application of International Application No. PCT/CN2020/117883, filed Sep. 24, 2020, which International Application was published on Apr. 1, 2021, as International Publication No. WO2021/057922. The International Application claims priority to Chinese Patent Application No. 201910931051.9, filed Sep. 29, 2019, the contents of which are incorporated herein by reference in their entireties.

TECHNICAL FIELD

The present invention relates to the technical field of vacuum coating, and more particularly relates to a vacuum coating device.

BACKGROUND

Physical vapor deposition (PVD) refers to a process technology of heating the metal to be coated under vacuum conditions to deposit the metal in a gaseous manner on a base material to form a coating. Physical vapor deposition can be classified into electric heating (resistance or induction) and electron beam PVD (EBPVD) by heating methods. As a surface modification and coating process, vacuum coating has been widely used in electronics, glass, plastics, and other industries. The main advantages of the vacuum coating technology include environmental protection, good coating performance, and diversity of coating materials. The key to apply the vacuum coating technology to continuous strip steel includes several aspects such as continuous, large area, high speed, and large scale of coating production. Since the 1980s, the world's major iron and steel companies have conducted lots of researches on this technology. With the maturity of hot-dip galvanizing and electro-galvanizing technologies, this technology has attracted unprecedented attention and is considered as an innovative surface coating process.

The key issue in the vacuum coating process is how to obtain a uniform coating with a consistent thickness through the arrangement of nozzles. At present, foreign published information mainly includes the following aspects.

1) Integrated Structure of Evaporation Crucible and Flow Distribution Nozzle

Applications BE1009321A6 and BE1009317A61 respectively disclose crucible nozzle structures as shown in FIG. 1 and FIG. 2. In the structure of FIG. 1, an upper cover 2 is arranged on an upper part of a crucible 1, so that a nozzle structure is formed between the upper cover 2 and a furnace wall for direct spray of evaporated metal. In the structure of FIG. 2, a filter plate 3 is additionally arranged in an evaporation crucible, and then metal steam is sprayed from a slit nozzle at the top. In the nozzle design processes of the two devices, one adopts a de Laval nozzle, and the other adopts a convergent nozzle. Regarding the orientation of the nozzles, one adopts lateral spray, and the other adopts vertical spray.

Applications JPS59177370A and U.S. Pat. No. 4,552,092A also disclose related evaporation crucible and nozzle structure. FIG. 3 illustrates a crucible nozzle structure with automatic replenishment of molten metal. A nozzle 4 uses a wider outlet, and a heater 5 is also arranged at an upper part of a crucible for heating the crucible. In the crucible nozzle structure shown in FIG. 4, the structure is spread by an arc 6 on one side, realizing lateral spraying; and a heating tube 7 is also arranged on the outer side of a crucible wall for heating the wall surface.

2) Split Structure of Evaporation Crucible and Flow Distribution Nozzle

Application WO2018/020311A1 discloses a split crucible nozzle structure. As shown in FIG. 5, in the device, the bottom of the crucible is connected to a molten metal supply tank 8, and an upper part of the supply tank 8 conveys metal steam to a tubular distributor and a steam nozzle at the front end through a split pipeline 9; and then, the nozzle sprays the metal steam to a metal plate at a high speed.

Application CN103249860A discloses a split flow distributor and a nozzle structure. As shown in FIG. 6, steam is delivered into an upper horizontal pipeline 10 through a vertical pipeline. The horizontal pipeline 10 is provided with a porous nozzle at the top to uniformly spray metal steam onto a surface of a metal plate.

Application CN101175866A discloses a metal steam flow distributor and a nozzle form. For a sectional form of a nozzle as shown in FIG. 7, a wire is wound outside a flow distributor pipeline 11 to heat the pipeline; and the nozzle has a square shell. As shown in FIG. 8, a ringlike pipeline made from another material is nested inside a square shell 12 and is used for spraying metal steam. A steam outlet used by the nozzle is porous.

The above-mentioned applications all relate to the specific forms of nozzles. However, not all of these nozzles can achieve sufficient uniform coating. For example, as shown in FIG. 6 and FIG. 7, since small holes of the nozzle are spaced round holes, after high-pressure gas is sprayed along the small holes, radial round spots are formed. In the movement process of a steel plate, if the round spots do not overlap each other, it is very easy to form a long-strip-shaped coating. On the other hand, if the round spots are too close to each other, the overlapping part of the round spots is easy to form a thicker coating, while the non-overlapping part forms a thinner coating, which leads to uneven coating of the steel plate.

In addition, these applications do not provide a method for quick and efficient vacuum coating on strip steel. From the point of view of matching of an on-site strip steel production line, in the case of a high delivery speed, in order to meet the requirements of the galvanizing flow rate of vacuum coating at a time, it is necessary to continuously increase the diameter of a conveying pipe and the volume of an evaporator, and the opening degree of a nozzle needs to be increased at the same time. However, the increase in the opening degree needs to be avoided as it is not conductive to the formation of a uniform coating on the longitudinal section.

SUMMARY

In order to solve the above-mentioned defects in the prior art, the present invention aims to provide a vacuum coating device which can form a uniform spray flow, so that when high-temperature steam contacts a low-temperature steel plate, a uniform coating can be formed on a surface of the steel plate; and a spray flow formed by subsequent sub-nozzles continuously covers the deposited metal layer that has been formed, so as to achieve efficient coating of a steel strip under vacuum conditions.

In order to achieve the foregoing objective, the present invention provides the following technical solutions.

Provided herein is a vacuum coating device, wherein the vacuum coating device is located below a steel plate when in use, and includes a crucible; wherein an induction heater is arranged on the outer side of the crucible; wherein the top of the crucible is connected to a flow distribution box through a steam pipeline; wherein a pressure regulating valve and a diverter valve are arranged in the steam pipeline; wherein the diverter valve is closer to the flow distribution box than the pressure regulating valve; wherein a horizontal pressure stabilizing plate is arranged in the flow distribution box; and wherein the top of the flow distribution box is connected to a plurality of sub-nozzles;
wherein a plurality of air flow distribution chambers are arranged in the diverter valve; and a ratio of a total cross-sectional area of the air flow distribution chambers in the radial direction ($S_{distribution}$) to a total cross-sectional area of the steam pipeline in the radial direction ($S_{pipeline}$) is 0.1, that is:

$$S_{distribution}/S_{pipeline} \geq 0.1.$$

If the ratio of $S_{distribution}$ to $S_{pipeline}$ is less than 0.1, the spray flow rate of steam is too small, which cannot meet the requirement for the thickness of a coating. If the ratio of $S_{distribution}$ to $S_{pipeline}$ is more than 1, the flow velocity at sub-nozzle outlets may be reduced, resulting in a decrease in an adhesion force between the coating and the steel plate. Therefore, preferably, $S_{distribution}/S_{pipeline}$ is 0.1 to 1.

The sub-nozzles are disposed in parallel at equal intervals, and the sub-nozzles are provided with sub-nozzle outlets. The distance between the sub-nozzle outlets and a movement speed of the steel plate satisfy the following relationship:

when the movement speed of the steel plate is 30-60 m/min, a centerline distance of the sub-nozzle outlets is 50-100 mm;

when the movement speed of the steel plate is 61-100 m/min, a centerline distance of the sub-nozzle outlets is 100-150 mm;

when the movement speed of the steel plate is 101-150 m/min, a centerline distance of the sub-nozzle outlets is 150-200 mm; and when the movement speed of the steel plate is 151-200 m/min, a centerline distance of the sub-nozzle outlets is 200-300 mm.

When the movement speed of the steel plate is low, a short spray distance is used. Although the spray cone formed after steam is ejected from the nozzle outlets covers a shorter length of the steel plate, the thickness of the spray can still meet the corresponding requirement. However, when the movement speed of the steel plate is increased, the same coating thickness may be achieved by adjusting the distance between the sub-nozzles and the steel plate. As the distance increases, the length of the steel plate covered by the spray cone increases. Accordingly, the duration from the start time point when the steel plate enters the spray cone to the end time point when the steel plate leaves the spray cone is increased, spray layers formed by the subsequent sub-nozzles continuously cover the previously formed coatings, and the superposed coating thickness can meet the requirement.

The sub-nozzle outlets are set to be of a slit type or a porous type, and a ratio of a sum of areas of the sub-nozzle outlets ($S_{outlet}$) to an area of a joint between the steam pipeline and the top of the crucible ($S_{inlet}$) (which also can be described as an area of the junction of the crucible and the steam pipeline ($S_{inlet}$)) is 0.05-5. If the ratio is less than 0.05, the spray flow rate of the steam is too small, which cannot meet the coating thickness requirement. If the ratio is too large, for example, if the ratio is greater than 5, the speed of the steam at the nozzle outlets may be extremely low, which results in a decrease in coating adhesion.

The slit type sub-nozzle outlets are linear or curved.

The porous type sub-nozzle outlets are set to be rectangular, circular or trapezoid, or are set to be arbitrarily polygonal or circular.

The sub-nozzles are made from a high-temperature-resistant and wear-resistant material, which can be structurally processed as described above. For example, the sub-nozzles can be made from graphite, ceramic, or inert metal.

Holes in the pressure stabilizing plate are rectangular, circular or triangular, or the holes may be of any polygon or circle in shape. The holes of the pressure stabilizing plate are linear, curved, or of a multilayer structure along a rising direction of the steam in terms of direction. Since the pressure stabilizing plate has a certain thickness, the direction of the holes refers to a path where the steam passes through the thickness direction of the pressure stabilizing plate. That is, when the steam passes through the pressure stabilizing plate, the distribution of the steam may be changed through the position distribution of the holes in the pressure stabilizing plate; and a rising path of the steam may also be changed through the direction of the holes. The multilayer structure refers to a structure where the steam is guided, by the direction of the holes, to rise in steps, for example, air flow steps formed by multiple groups of fold lines. The structure may increase the resistance of the pressure stabilizing plate to the air flow, but can make the steam be distributed more uniformly.

In the technical solution of the present application, the pressure stabilizing plate may be a porous type medium pressure stabilizing plate. The pressure stabilizing plate of this type filters air through honeycomb-like irregular holes, and the air flow distribution can be changed by using different porosities according to production needs, thereby achieving the objective of making the air flow uniform.

A ratio of a total area of the holes in the pressure stabilizing plate ($S_{total\ hole\ area}$) to the area of the joint between the steam pipeline and the top of the crucible ($S_{inlet}$) is greater than or equal to 0.1, that is, $S_{total\ hole\ area}/S_{inlet} \geq 0.1$. The pressure and speed of the sub-nozzle outlets may be adjusted according to the ratio of the areas. When the ratio is less than 0.1, the speed of air passing through the sub-nozzle outlets is too low, thereby reducing the adhesion force of the coating. When the ratio is greater than 10, energy dissipation occurs, which results in incapability of a significant increase in the speed of the air flow at the sub-nozzle outlets.

According to the vacuum coating device provided by the present invention, the metal steam is obtained by melting and evaporating the metal by heating by an induction crucible. The steam enters the flow distribution box through the pipeline. The diverter valve and the pressure stabilizing plate are arranged in the flow distribution box. The flowing direction of the metal steam is changed after passing through the diverter valve, and the metal steam is divided into 2 to 5 strands of steam flows. These steam flows are then distributed into the corresponding sub-nozzles. A pressure stabilizing plate with porous structure is provided at the position of the flow distribution box close to the internal sub-nozzles. The sub-nozzles are disposed in parallel at equal intervals. The steam passing through the pressure stabilizing plate is sprayed out by the sub-nozzles at various levels to form the uniform spray flow. When the high-temperature steam spray flow contacts the low-temperature steel plate, a uniform coating is formed on the surface of the steel plate. Subsequently, the spray flow sprayed from the sub-nozzles arranged behind in the movement direction of the steel plate forms a new metal layer on the steel plate. The new metal coating layers continuously covers the deposited metal layer sprayed by the sub-nozzles arranged at the front, so that the steel strip can realize the coating thickness that requires multiple deposition operations in the prior art by performing one run in the same direction, which avoids the problem of poor adhesion between the coatings interfaces due to the multiple coating operations in the prior art. The device of the present disclosure has low investment, is easy to operate, and may be exported in a complete set with a vacuum coating technology in the future.

DETAILED DESCRIPTION

Figure 1:
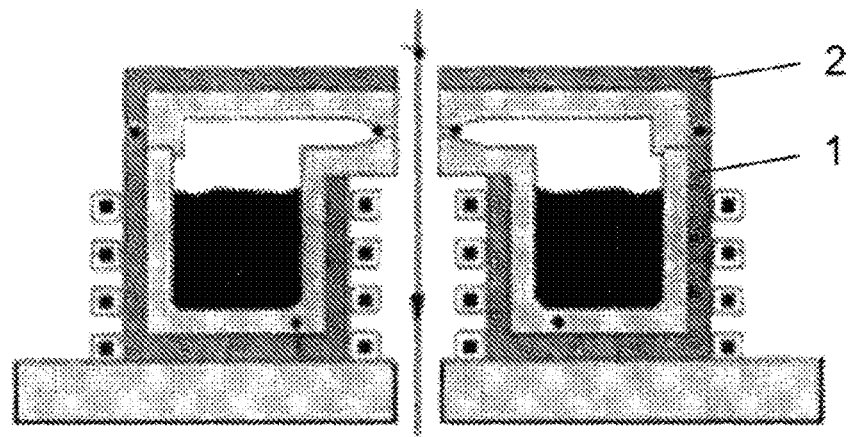
FIG. 1 is a schematic diagram of application BE1009321A6.
Figure 2:
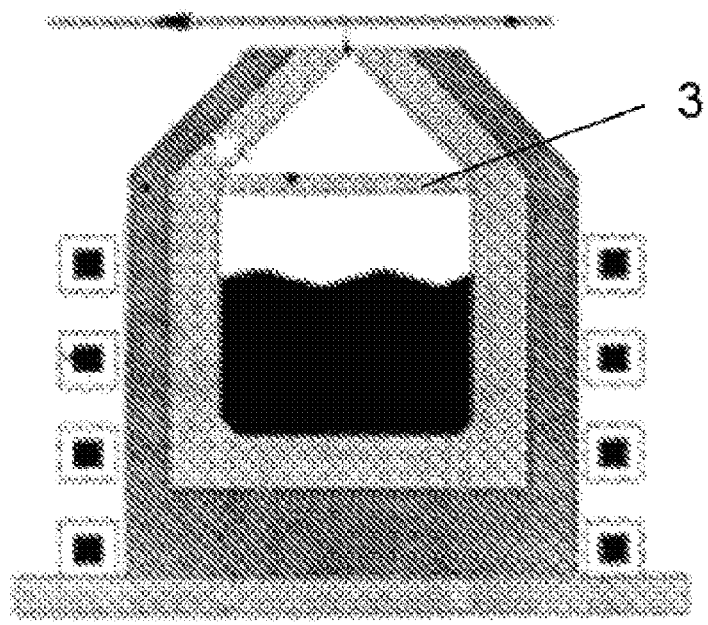
FIG. 2 is a schematic diagram of application BE1009317A61.
Figure 3:
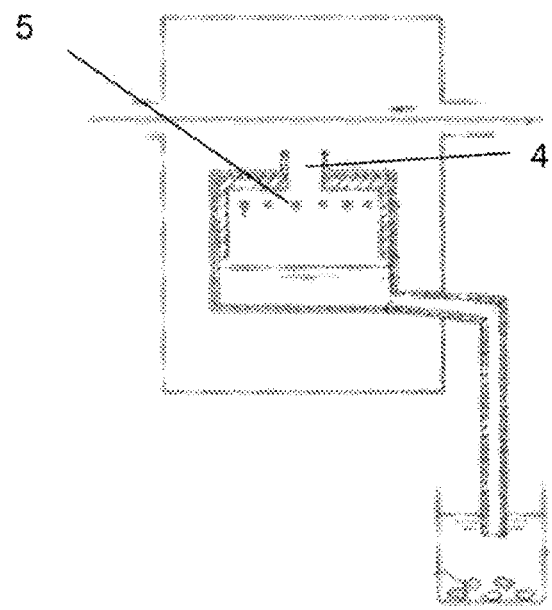
FIG. 3 is a schematic diagram of application JPS59177370A.
Figure 4:
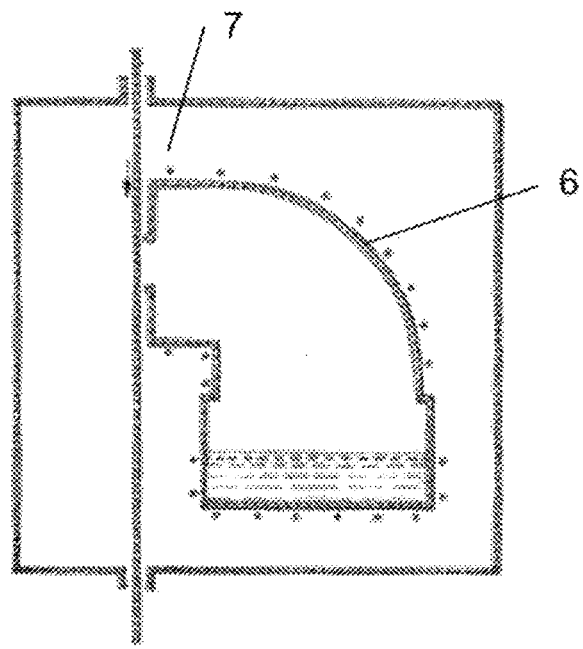
FIG. 4 is a schematic diagram of application U.S. Pat. No. 4,552,092A.
Figure 5:
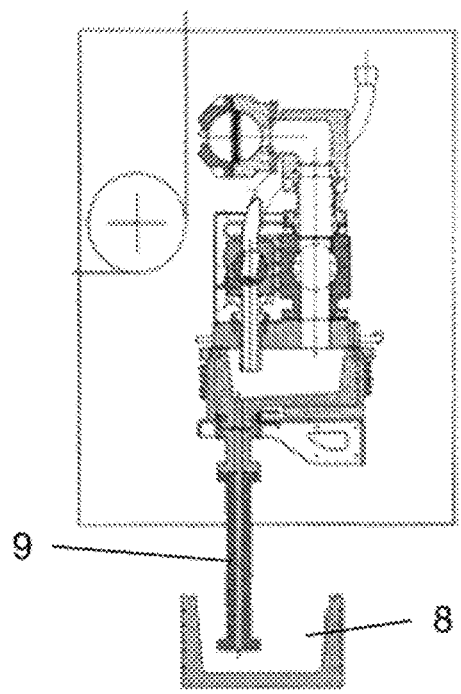
FIG. 5 is a schematic diagram of application WO2018/020311A1.
Figure 6:
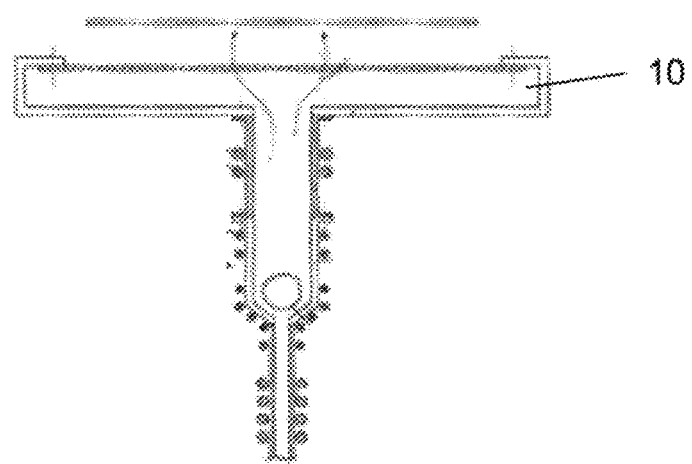
FIG. 6 is a schematic diagram of application CN103249860A.
Figure 7:
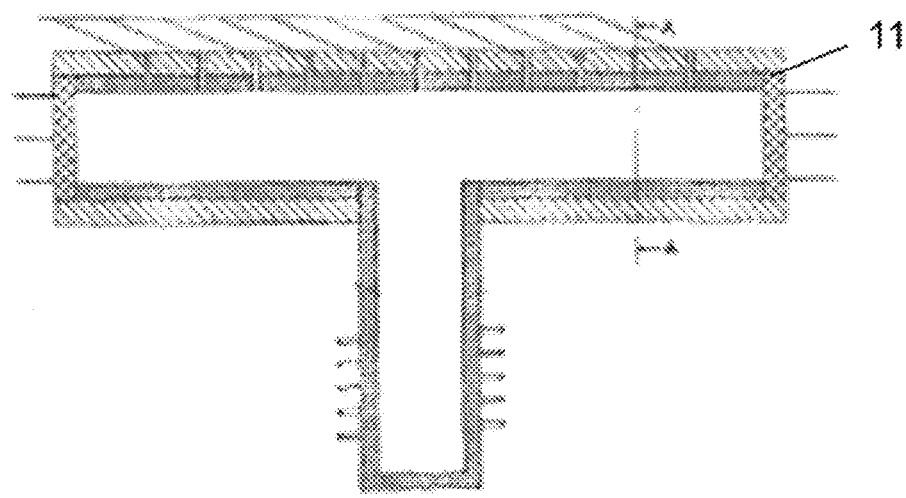
FIG. 7 is a schematic diagram of application CN101175866A.
Figure 8:
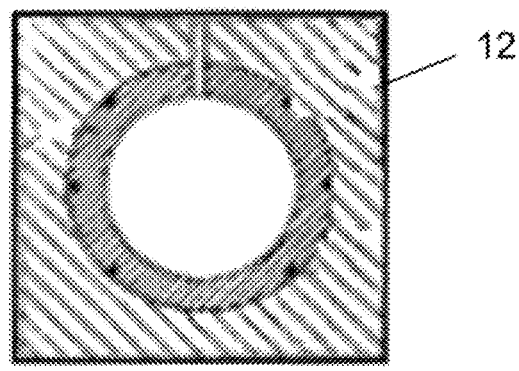
FIG. 8 is a schematic diagram of the square shell in FIG. 7.
Figure 9:
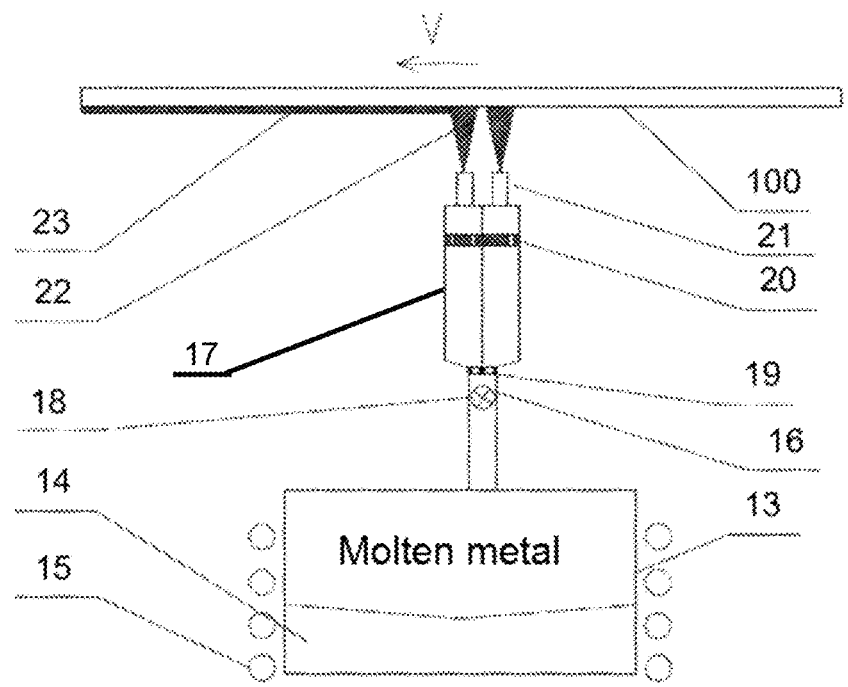
FIG. 9 is a schematic structural diagram of a vacuum coating device of the present invention.

The technical solutions of the present invention are further described below with reference to the accompanying drawings and embodiments.

Referring to FIG. 9 to FIG. 12, the present invention provides a vacuum coating device. The vacuum coating device is located below a steel plate 100 when in use. The vacuum coating device includes a crucible 13. The crucible 13 contains molten metal 14. An induction heater 15 is arranged on the outer side of the crucible 13. The top of the crucible 13 is connected to a flow distribution box 17 through a steam pipeline 16. A pressure regulating valve 18 and a diverter valve 19 are sequentially arranged in the direction in which the steam pipeline 16 is in communication with the flow distribution box 17. A horizontal pressure stabilizing plate 20 is arranged in the flow distribution box 17. The top of the flow distribution box 17 is connected to a plurality of sub-nozzles 21.

Preferably, the diverter valve 19 may be in various shapes such as circle, triangle, trapezoid, and rectangle. The main function of the diverter valve 19 is to uniformly distribute the steam passing through the steam pipeline 16 to the flow distribution box corresponding to each sub-nozzle. A plurality of air flow distribution chambers 1901 are arranged in the diverter valve 19. The ratio of the total cross-sectional area of the air flow distribution chambers 1901 in the radial direction ($S_{distribution}$) to the cross-sectional area of the steam pipeline 16 in the radial direction ($S_{pipeline}$) is greater than or equal to 0.1, that is: $S_{distribution}/S_{pipeline} \geq 0.1$. Preferably, $S_{distribution}/S_{pipeline}$ is 0.1-1.

Figure 10:
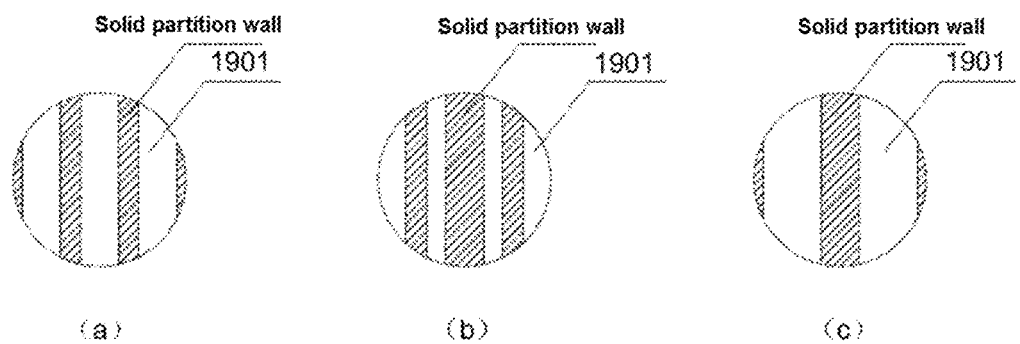
FIG. 10 is a schematic diagram of an interior of a diverter valve in the vacuum coating device of FIG. 9, wherein (a) is a three-stage diverter valve, (b) is a four-stage diverter valve, and (c) is a two-stage diverter valve.
Figure 11:
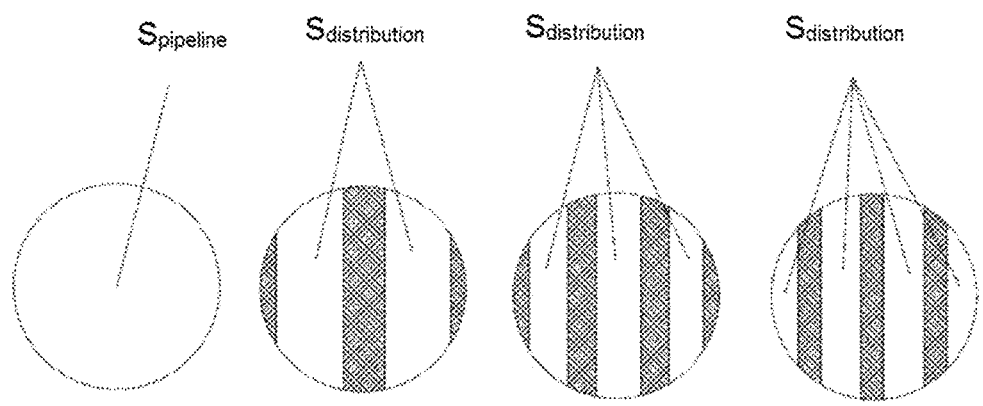
FIG. 11 is a schematic diagram of $S_{distribution}$ and $S_{pipeline}$ in the diverter valve of FIG. 10.
Figure 12:
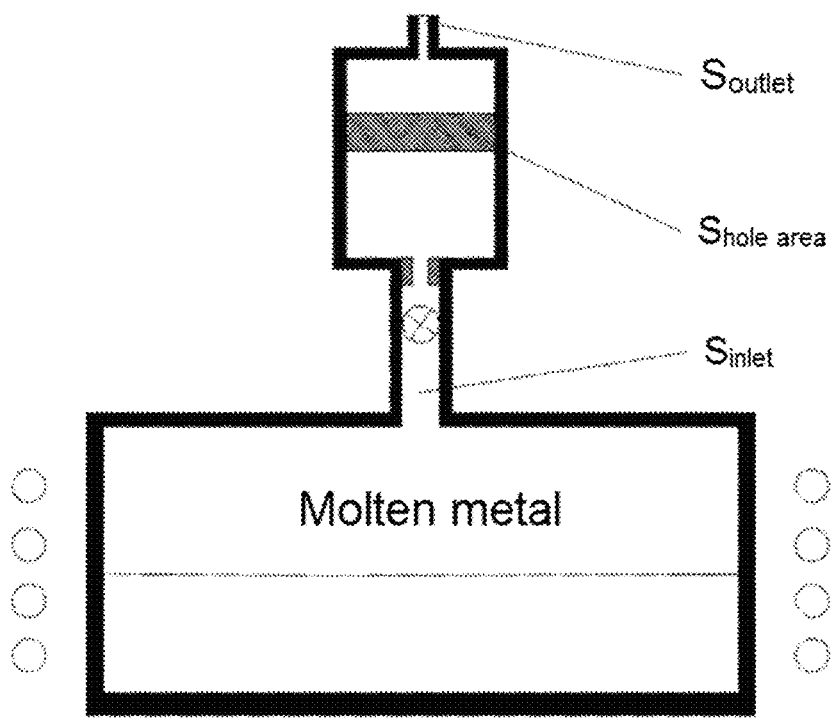
FIG. 12 is a schematic diagram of positions of $S_{total\ hole\ area}$, $S_{inlet}$, and $S_{outlet}$ in the vacuum coating device of the present invention.

Preferably, when two stages of sub-nozzles 21 are used, the diverter valve 19 as shown in FIG. 10 (c) can be adopted; when three stages of sub-nozzles 21 are used, the diverter valve 19 as shown in FIG. 10 (a) can be adopted; and when four stages of sub-nozzles 21 are used, the diverter valve 19 as shown in FIG. 10 (b) can be adopted. In the present application, n stages of sub-nozzles refer to the number of working nozzles. For example, two stages of sub-nozzles mean that there are two sub-nozzles that are working, three stages of sub-nozzles mean that there are three sub-nozzles that are working, and so on. Meanwhile, n is equal to the number of the distribution chambers 1901. Generally, n is an integer from 2 to 5.

Preferably, all the sub-nozzles are linearly arranged at equal intervals along a movement direction of the steel plate; wherein the sub-nozzles are provided with sub-nozzle outlets; and wherein the relation between a centerline distance of the sub-nozzle outlets and the movement speed of the steel plate 100 is as follows:

when the movement speed of the steel plate 100 is 30-60 m/min, a centerline distance of the sub-nozzle outlets is 50-100 mm;

when the movement speed of the steel plate 100 is 61-100 m/min, a centerline distance of the sub-nozzle outlets is 100-150 mm;

when the movement speed of the steel plate 100 is 101-150 m/min, a centerline distance of the sub-nozzle outlets is 150-200 mm; and when the movement speed of the steel plate 100 is 151-200 m/min, a centerline distance of the sub-nozzle outlets is 200-300 mm.

Preferably, the sub-nozzle has an internal pressure of 500-500000 Pa during working.

Preferably, the sub-nozzles 21 may be graphite, ceramic, inert metal, or other machinable materials.

Preferably, the sub-nozzle outlet is set to be of a slit type or a porous type, and a ratio of areas of the sub-nozzle outlets ($S_{outlet}$) to an area of a joint between the steam pipeline 16 and the top of the crucible 13 ($S_{inlet}$) is 0.05-5.

Preferably, the sub-nozzle outlet is a slit type sub-nozzle outlet; and the slit type sub-nozzle outlet is set to be linear or curved.

Preferably, the pressure stabilizing plate 20 is set to be of a porous structure in any shape. Holes in the pressure stabilizing plate 20 are linear, curved, or of a multilayer structure in terms of direction.

Preferably, a ratio of a total area of the holes in the pressure stabilizing plate 20 ($S_{total\ hole\ area}$) to the area of the joint between the steam pipeline 16 and the top of the crucible 13 ($S_{inlet}$) is greater than or equal to 0.1 and less than or equal to 10, that is, $0.1 \leq S_{total\ hole\ area}/S_{inlet} \leq 10$.

Preferably, the molten metal 14 may contain zinc, magnesium, aluminum, tin, nickel, copper, iron, and other metals, and may further contain oxides of these elements having a low melting point (lower than 2000° C.).

Preferably, the steel plate 100 is cleaned by a plasma device before vacuum coating, and a preheating temperature reaches 80-300° C.

A specific working process of the vacuum coating device of the present invention is as follows.

1) A metal block is heated by the induction heater 15 in the crucible 13 and melted into molten metal 14, and the molten metal 14 vaporizes at a higher degree of superheat and a low pressure to gradually form a metal steam 22.
2) At the beginning, the pressure regulating valve 18 on the steam pipeline 16 connected to the crucible 13 is closed; as the molten metal 14 continuously vaporizes, the steam pressure of an inner chamber of the crucible 13 continuously increases; and when the inner chamber of the crucible 13 reaches a certain pressure (for example, 5000-500000 Pa), the pressure regulating valve 18 is opened to ensure constant pressure output as far as possible.
3) Meanwhile, the power of the induction heater 15 is increased to compensate for the reduced pressure due to the opening of the pressure regulating valve 18; and the power range of the induction heater 15 is adjusted to keep the pressure of the inner chamber of the crucible 13 to be within a certain range.
4) After the pressure regulating valve 18 is opened, the metal steam 22 flows towards the flow distribution box 17 along the steam pipeline 16; the diverter valve 19 divides the metal steam 22 into 2-5 strands of steam flows; these strands of steam flows are then distributed into the corresponding flow distribution boxes 17; the flow distribution box 17 is internally provided with the pressure stabilizing plate 20 having porous structure; and the sub-nozzles 21 are disposed in parallel at equal intervals.
5) Under the effect of the pressure stabilizing plate 20 to the strands of steam flows, the pressures of the dispersed high-speed flows are reduced, and the steam flows uniformly flow out along the small holes in the pressure stabilizing plate 20 and then uniformly flow out from the outlet of the sub-nozzle 21; and since the outlet of the sub-nozzle 21 is narrow, the metal steam 22 flows out of the outlet at a relatively high speed.
6) Meanwhile, the moving steel plate 100 is arranged above; the metal steam 22 with a higher temperature quickly solidifies when contacting the steel plate 100 with a lower temperature to form a metal coating 23. All the sub-nozzles are disposed at equal intervals along the movement direction of the steel plate, so that a thicker coating is completed at one time.

Examples

The surface of the steel plate 100 was galvanized via vapor deposition. The width of the steel plate 100 was 1000 mm. After being cleaned and dried, the steel plate 100 was heated to 150° C. The induction heater 15 heated the steel plate to evaporate zinc, and the pressure regulating valve 18 was in a closed state before the pressure in the crucible 13 reached 30000 Pa by means of controlling the power. After the air pressure in the crucible 13 reached 30000 Pa, the pressure regulating valve 18 was opened, and the metal steam 22 entered the steam pipeline 16. The diverter valve 19 used circular two-stage flow distribution, wherein $S_{distribution}/S_{pipeline}=0.4$. The pressure stabilizing plate 20 was of a porous structure, wherein $S_{total\ hole\ area}/S_{inlet}=4$. The internal working pressure of the sub-nozzle 21 was 10000 Pa. The material of the sub-nozzle 21 was graphite. The outlet of the sub-nozzle 21 was in the shape of linear slit, wherein $S_{outlet}/S_{inlet}=1$.

Those of ordinary skill in the art should realize that the above embodiments are only used to illustrate the present invention, but not used to limit the present invention. Changes and modifications made to the above embodiments without departing from the essential spirit scope of the present invention shall all fall within the scope of the claims of the present invention.

The invention claimed is:

1. A vacuum coating device comprising:
   a crucible;
   an induction heater arranged on the outer side of the crucible;
   a flow distribution box connected to the top of the crucible through a steam pipeline;
   a pressure regulating valve and a diverter valve sequentially arranged in a direction in which the steam pipeline is in communication with the flow distribution box;
   a horizontal pressure stabilizing plate arranged in the flow distribution box;
   a plurality of sub-nozzles connected to the top of the flow distribution box;
   wherein a plurality of air flow distribution chambers are arranged in the diverter valve;
   a ratio of a total cross-sectional area of the air flow distribution chambers in the radial direction ($S_{distribution}$) to the cross-sectional area of the steam pipeline in the radial direction ($S_{pipeline}$) is greater than or equal to 0.1, that is:

$S_{distribution}/S_{pipeline} \geq 0.1$.

2. The vacuum coating device as claimed in claim 1, wherein the sub-nozzles are disposed in parallel at equal intervals, wherein the sub-nozzles are provided with sub-nozzle outlets; and wherein a distance between the sub-nozzle outlets and a movement speed of a steel plate satisfy the following relationship:
   when the movement speed of the steel plate is 30-60 m/min, a centerline distance of the sub-nozzle outlets is 50-100 mm;
   when the movement speed of the steel plate is 61-100 m/min, a centerline distance of the sub-nozzle outlets is 100-150 mm;
   when the movement speed of the steel plate is 101-150 m/min, a centerline distance of the sub-nozzle outlets is 150-200 mm; and
   when the movement speed of the steel plate is 151-200 m/min, a centerline distance of the sub-nozzle outlets is 200-300 mm.

3. The vacuum coating device as claimed in claim 1, wherein the sub-nozzle outlets are set to be of a slit outlet or a porous outlet, and wherein a ratio of a sum of areas of the sub-nozzle outlets ($S_{outlet}$) to an area of a joint between the steam pipeline and the top of the crucible ($S_{inlet}$) is 0.05-5.

4. The vacuum coating device as claimed in claim 3, wherein the slit outlet sub-nozzle outlets are set to be linear or curved.

5. The vacuum coating device as claimed in claim 3, wherein the porous outlet sub-nozzle outlets are set to be rectangular, circular or trapezoid.

6. The vacuum coating device as claimed in claim 3, wherein the sub-nozzles are made from graphite, ceramic, or a metal material.

7. The vacuum coating device as claimed in claim 1, wherein the pressure stabilizing plate is of a porous structure, and wherein holes are rectangular, circular, triangular, trapezoid, or slit-shaped.

8. The vacuum coating device as claimed in claim 1, wherein a ratio of a total area of the holes in the pressure stabilizing plate ($S_{total\ hole\ area}$) to the area of the joint between the steam pipeline and the top of the crucible ($S_{inlet}$) is greater than or equal to 0.1 and less than or equal to 10, that is:

$$10 \geq S_{total\ hole\ area}/S_{inlet} \geq 0.1.$$

9. The vacuum coating device as claimed in claim 8, wherein the holes in the pressure stabilizing plate are linear, curved, or of a multilayer structure in terms of direction.

* * * * *